Nov. 7, 1967 L. N. HERMANN 3,351,826

FIVE-REGION, THREE ELECTRODE, SYMMETRICAL SEMICONDUCTOR DEVICE, WITH RESISTIVE MEANS CONNECTING CERTAIN REGIONS

Filed Feb. 5, 1963

INVENTOR.
LEROY N. HERMANN
BY
Mason, Kolehmainen, Rathburn and Wyss
ATTORNEYS.

United States Patent Office 3,351,826
Patented Nov. 7, 1967

3,351,826

FIVE-REGION, THREE ELECTRODE, SYMMETRICAL SEMICONDUCTOR DEVICE, WITH RESISTIVE MEANS CONNECTING CERTAIN REGIONS

Leroy N. Hermann, 707 Mosedale St., St. Charles, Ill. 60174

Filed Feb. 5, 1963, Ser. No. 256,368
5 Claims. (Cl. 317—235)

This invention relates to a semiconductor device and, more particularly, to a symmetrical five layer gated diode.

Four and five layer diode constructions have been developed in the past for use in switching and control applications in welding and light dimming control circuits, in motor speed control circuits, and many other circuits in which solid state switching techniques would be desirable. The Shockley or four layer diode is not satisfactory in applications requiring the switching of alternating current loads because of the excessive heating encountered in the unit, and five layer break-over diodes are quite restricted in use because somewhat complicated and unreliable circuitry is required to control these units. Five layer PNPNP gated diodes have been proposed, but these units require virtually as much gating or switching current as the load current to be controlled with the result that excessive heating is commonly encountered. As an example, commercially available units require control or gating currents on the order of one ampere to control the conduction of between five to fifteen amperes through the diode. In addition, these units are not truly symmetrical in the sense that a load energized by an applied potential of either polarity can be controlled with a gate or control signal of either polarity with the result that the semiconductor devices cannot be used in as broad a field as desired.

Accordingly, one object of the invention is to provide a new and improved controlled conduction device.

Another object is to provide a new and improved five layer gated diode exhibiting true symmetrical conducting and control characteristics.

A further object is to provide a five layer NPNPN device having a pair of output electrodes, a gate electrode, and resistive means connecting the base N-type material with the adjacent P-type areas.

A further object is to provide a gated five layer diode having the characteristic of being operable between resistive states on the order of $10^9$ ohms and $10^0$ ohms with applied potentials of either polarity and with gate signals of either polarity.

In accordance with these and many other objects, an embodiment of the invention comprises a wafer, base layer or block of semiconductor material, such as silicon, which has been doped with a donor impurity, such as phosphorus, to provide an N conductivity type base layer. The opposite major surfaces of the base layer are then alloyed or diffused with an acceptor impurity material, such as boron, to provide two P-type areas on the opposite major faces of the base layer or wafer. A portion of each of the two P-type areas is then converted into N conductivity type areas by the diffusion or alloying of a donor impurity material, such as phosphorus.

The N-type base layer is resistively coupled to each of the adjacent P-type areas as by applying an epoxy resistive material bridging adjacent portions of the base layer and the P-type areas on both major faces of the base layer or wafer. Electrodes are secured to the two N-type areas, and an ohmic contact is established to the base layer of N-type material to provide a gated five layer diode.

This device has the characteristic that when a potential of either polarity is applied between the two electrodes in a nonconductive state, the device presents a substantially resistive impedance on the order of $10^9$ ohms. When a gating signal of either polarity is applied to the gate electrode, the diode is switched to a conductive state exhibiting a resistive impedance on the order of $10^0$ ohms. This device is capable of switching direct or alternating currents in the range between 16 and 25 amperes with a gating current on the order of 10 milliamps. Thus, the gated five layer diode provides true symmetry with respect to operating potentials and gate or control signal potential and is capable of switching relatively large amperage loads without drawing excessive gating current with the attendant reduction in heating.

Many other objects and advantages of the present invention will become apparent from considering the following detailed description in conjunction with the drawings, in which.

Figure 1:
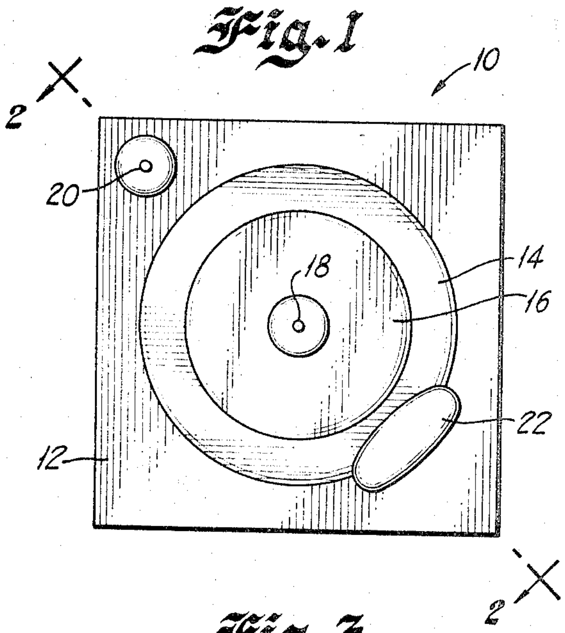
FIG. 1 is a plan view of a gated five layer diode embodying the present invention.
Figure 2:
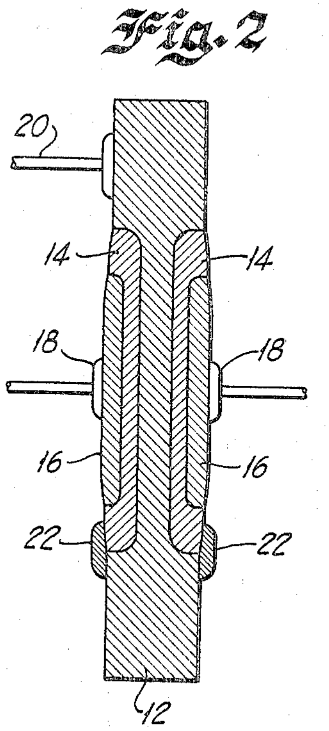
FIG. 2 is a sectional view taken along line 2—2 in FIG. 1.

Referring now more specifically to FIGS. 1 and 2 of the drawings, therein is disclosed a gated five layer controlled conduction device or diode which is indicated generally as 10 and which embodies the present invention. The diode 10 includes a base layer, body, or wafer 12 of N-type material having two opposed major surfaces or faces each of which contains an area 14 of P-type material. An area 16 of N-type material is formed in each of the areas 14, and an electrode 18 is connected to each of the N-type areas 16. A gate electrode 20 provides an ohmic contact to the base layer 12.

A resistive means 22 is applied to each of the major faces of the base layer 12 in a position bridging the base layer 12 and an adjacent portion of the P-type area 14 to provide a resistive interconnection between these two areas.

When an alternating or direct current potential of either polarity is applied across the device 10 by connection to the electrodes 18, the device 10 can be changed from a nonconductive state in which an impedance on the order of $10^9$ ohms is presented between the electrodes 18 to a conductive state in which the device 10 presents an impedance on the order of one ohm by applying a gate signal of either polarity to the gate electrode 20. Thus, the device 10 is symmetrical both with regard to operating potential and control or gate potentials.

In one method of forming the gated five layer diode 10, the base layer 12 comprises a silicon slice or wafer .15 inch square and 10 mils in thickness which has been doped with one of the materials well known in the art to provide an N-type conductivity characteristic. The outer surfaces of the layer 12 can be passivated, if desired. The base layer 12 is treated with a perchloroethylene bath to remove oil and dirt and is then washed in distilled water. A photoresist material is then applied to all of the surfaces of the base layer 12 except two areas on the opposite major faces of the layer in which the P-type areas 14 are to be formed. The base layer 12 is then exposed to a mild etch, such as one comprising a six to one solution of acetic acid and nitric acid, for a short interval on the order of five seconds. The base layer 12 is then washed again in distilled water.

To form the P-type areas 14, an acceptor doping material, such as one continuing a minute quantity of boron, is applied to the etched areas on the major surfaces of the water 12, and the wafer is heated at a temperature on the order of 600° C. for a period of time long enough to partially diffuse the boron doping material into the silicon to convert the areas 14 to a P conductivity type. The base layer 12 is again washed in distilled water, and a second layer of photoresist material is applied to all of the surfaces of the base layer 12 except those in which the N-type layers 16 are to be formed. The layer 12 is then given a second etching with the solution consisting of acetic, nitric, and hydrofluoric acid.

To create the N-type layer or area 16, a donor doping material, such as one containing phosphorus, is applied to the areas 16, and the base layer 12 is heated to a temperature on the order of 600° C. to partially diffuse the donor impurity into the areas 14 on both surfaces of the layer 12 to convert a portion of this material to provide the two N-type conductivity areas 16. Following this diffusing or alloying operation, the wafer 12 is again washed, and the electrodes 18 are centrally secured to the two N-type areas 16 on the opposite major surfaces or faces of the base layer 12.

The gate electrode 20 is formed by applying a third layer of masking or photoresist material covering the entire base layer 12 with the exception of the area on one side of the base of this layer illustrated in FIG. 1. After etching to a depth sufficient to expose the N-type base material 12, the device 10 is removed from the etching solution, washed, and the gate electrode 20 is secured to the base layer 12 to provide an ohmic contact.

To provide the resistive means bridged between the base layer 12 and the adjacent P-type area 14 on both major surfaces of the base layer 12, an epoxy resistive material, such as that obtained from Mansol Ceramics of Belleville, N.J., is applied to the opposite faces of the layer 12 bridging the base layer with the adjacent P-type areas 14 to provide a resistive connection between these two areas of the device 10.

If desired, the surfaces of the device 10 can be passivated during and following manufacture by the formation of an oxide layer to prevent contamination of the components. Further, the completed device 10 preferably is encapsulated to provide protection for the unit as well as a heat dissipating means therefor. One suitable method of encapsulation comprises emersing the unit in a mixture of LB–248 resin and catalyst containing 200% by volume of aluminum oxide and baking the unit at 200° F. This encapsulation provides a completed unit approximately one inch square and having a thickness of one-half inch. The LB–248 resin and catalyst can be obtained from Concord Chemical and Plastic Co.

Figure 3:
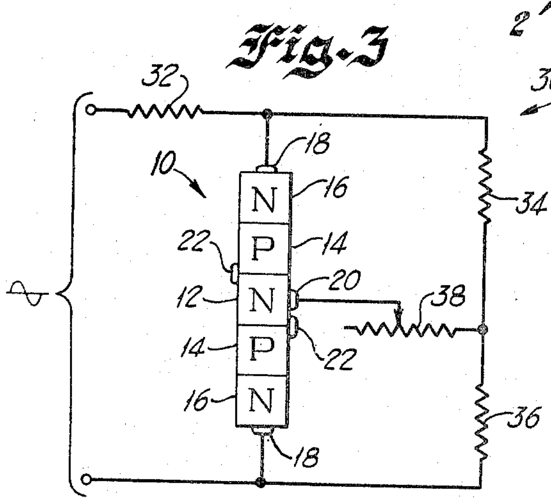
FIG. 3 is a schematic view of a control circuit utilizing the diode construction illustrated in FIGS. 1 and 2.

One use of the gated five layer symmetrical diode 10 to control an alternating current load is illustrated in the schematic diagram of a control circuit 30 illustrated in FIG. 3 of the drawing. The circuit 30 includes a load device, such as a resistance element 32, connected in series with the diode 10 across an alternating current potential source. One electrode 18 of the device 10 is connected to one terminal of the load 32, and the other electrode 18 is connected to one terminal of the potential source. The gate electrode 20 is connected to a voltage dividing network including a pair of resistance elements 34 and 36 through an adjustable resistance 38. When the potential applied across the device 10 from the alternating current potential source is at zero, the device 10 presents an impedance measured between the electrodes 18 on the order of $10^9$ ohms, and no current flows through the load device 32.

Assuming that the potential applied to the uppermost electrode 18 rises in a positive direction relative to the potential applied to the lower electrode 18, the voltage divider including the resistance elements 34 and 36 also supplies an increasing positive potential to the gate electrode 20. When this potential increases to a predetermined level, a gate current flows through the electrode 20 and the diode 10 is switched to its conductive condition in which it presents a very low impedance on the order of one ohm between the electrodes 18. The load device 32 is now connected in series with and directly across the potential source. As the applied potential approaches zero, the diode 10 is restored in a nonconductive state to terminate the flow of current through the load device 32.

Figure 4:
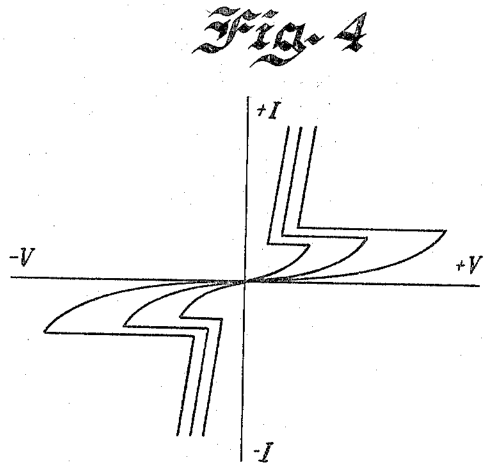
FIG. 4 illustrates a family of characteristic curves showing the operation of the diode construction as a gated device.

As the potential on the lower electrode 18 (FIG. 3) swings positive relative to the upper electrode 18 and the potential applied to the gate electrode 20 becomes sufficiently high, the diode 10 returns to a conductive condition presenting a low impedance so that the current again flows through the load device 32 in an opposite direction to the direction of flow during the preceding half-cycle of the input potential. The device 10 is restored to a nonconductive condition when the applied potential approaches zero. This completely symmetrical operation of the diode 10 for different values of gate currents is illustrated in the family of characteristic curves shown in FIG. 4.

Figure 5:
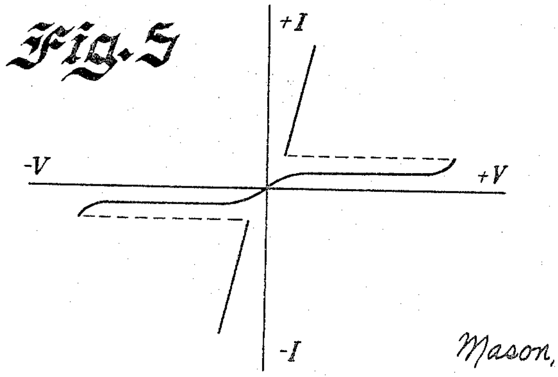
FIG. 5 illustrates a characteristic curve of the device operated as a break-over diode.

The device 10 requires a gate current on the order of only 10 milliamps to switch a load current to the device 32 in the range between 16 and 25 amperes and is truly symmetrical in permitting current flow through the device 10 and the load 32 in either direction in dependence on the polarity of the applied potential. Further, the gated diode 10 can be placed in a conductive condition with gate or control signals of either potential when operating potentials of either polarity are applied to the electrodes 18. In addition, the device 10 can operate as a symmetrical break-over diode as illustrated by the characteristic curve shown in FIG. 5 of the drawings.

Although the present invention has been described with reference to a single illustrative embodiment thereof, it should be understood that numerous other modifications and embodiments can be devised by those skilled in the art that will fall within the spirit and scope of the present invention.

What is claimed and desired to be secured by Letters Patent of the United States is:

1. A controlled conduction device comprising a layer of N-type material, a P-type impurity containing region on each of the major surfaces of the layer, an N-type impurity containing region at the outer surface of each of the P-type impurity containing regions, separate electrode means for each of the N-type impurity containing regions, means providing an ohmic contact to the layer, said electrode means and said means providing an ohmic contact providing the sole external connections to the device, and separate resistive means connecting the layer of N-type material to each of the P-type impurity containing regions.

2. A symmetrical five layer controlled conduction device comprising a base layer of N-type material, a region of P-type material on each of the opposite major faces of the base layer, a region of N-type material in each of the regions of P-type material, electrode means connected to each of the N-type regions, means providing an ohmic contact with the base layer, and a pair of resistive means, one connected between the base layer and the P-type region at one of said major faces of the base layer and the other connected between the base layer and P-type region at another of said major faces of the base layer.

3. A symmetrical five layer controlled conduction device comprising a base layer of one conductivity type, a region of an opposite conductivity type on each of the opposite major faces of the base layer, a region of the one conductivity type in each of the regions of the opposite conductivity type, electrode means connected to each of the regions of the one conductivity type, means providing an ohmic contact to the base layer, and a pair of resistive means connected between the base layer and different ones of the adjacent regions of the opposite conductivity type.

4. A symmetrical five layer controlled conduction device comprising a wafer of semiconductor material of a first conductivity type, regions of opposite conductivity type formed on each of the opposite major faces of the wafer, a region of the one conductivity type formed in each of the regions of the opposite conductivity type, electrode means connected to each of the regions of the one conductivity type, said device operative in a first condition to present a resistance on the order of $10^9$ ohms measured between said electrode means, resistive means applied to the opposite major faces of the wafer and bridging the wafer to the adjacent areas of opposite conductivity type, and gate means providing an ohmic contact to the wafer and effective upon the application of a switching current on the order of 10 milliamperes to said ohmic contact to place said device in a second condition wherein said device presents a resistance on the order of one ohm to a current in the range of 16 to 25 amperes through the device between the electrode means.

5. A symmetrical five layer controlled conduction device comprising a wafer having a first region of semiconductor material of one conductivity type, a region of opposite conductivity type formed on each of the opposite major faces of the wafer, a second region of the one conductivity type formed in each of the regions of the opposite conductivity type, a pair of resistive means formed on the opposite major faces of the wafer and each connecting said first region of one conductivity type to one region of the opposite conductivity type, electrode means connected to each of the regions of the one conductivity type, said device normally presenting a resistance on the order of $10^9$ ohms to a potential of either polarity applied across said electrode means, and gate means providing an ohmic contact to said first region of one conductivity type for reducing the resistance through the device between the electrode means to a value on the order of one ohm upon application of an electrical potential of either polarity to said ohmic contact.

References Cited

UNITED STATES PATENTS

| | | | |
|---|---|---|---|
| 2,891,171 | 6/1959 | Shockley | 307—88.5 |
| 2,936,384 | 5/1960 | White | 307—88.5 |
| 2,980,810 | 4/1961 | Goldey | 317—235 |
| 3,123,750 | 2/1964 | Hutson et al. | 317—235 |
| 3,140,963 | 7/1964 | Svedberg | 148—33.5 |
| 3,260,901 | 7/1966 | Luescher et al. | 317—235 |

FOREIGN PATENTS

| | | |
|---|---|---|
| 1,267,417 | 7/1961 | France. |
| 901,239 | 7/1962 | Great Britain. |

JOHN W. HUCKERT, *Primary Examiner.*

J. SHEWMAKER, *Assistant Examiner.*